(12) United States Patent
Ui

(10) Patent No.: US 7,851,367 B2
(45) Date of Patent: Dec. 14, 2010

(54) METHOD FOR PLASMA PROCESSING A SUBSTRATE

(75) Inventor: Akio Ui, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 11/724,308

(22) Filed: Mar. 15, 2007

(65) Prior Publication Data

US 2008/0057222 A1 Mar. 6, 2008

(30) Foreign Application Priority Data

Aug. 31, 2006 (JP) ............................ P2006-237012

(51) Int. Cl.
*H01L 21/302* (2006.01)
*H01L 21/461* (2006.01)

(52) U.S. Cl. .................... 438/706; 438/714; 216/64; 216/67

(58) Field of Classification Search ................. 438/706, 438/710, 712, 714, 729; 216/67, 71
See application file for complete search history.

(56) References Cited

U.S. PATENT DOCUMENTS

| 5,741,396 | A | * | 4/1998 | Loewenstein | ............... | 438/724 |
| 6,054,063 | A | | 4/2000 | Ohtake et al. | | |
| 6,635,185 | B2 | * | 10/2003 | Demmin et al. | ............... | 216/64 |
| 2004/0219797 | A1 | | 11/2004 | Honda et al. | | |
| 2005/0214477 | A1 | * | 9/2005 | Hanawa et al. | .............. | 427/569 |
| 2006/0011468 | A1 | * | 1/2006 | Boardman et al. | ..... | 204/192.12 |
| 2006/0244386 | A1 | * | 11/2006 | Hooke et al. | ........... | 315/111.21 |
| 2008/0053818 | A1 | | 3/2008 | Ui | | |

FOREIGN PATENT DOCUMENTS

| JP | 11-16892 | 1/1999 |
| JP | 11-67725 | 3/1999 |
| JP | 2003-234331 | 8/2003 |
| JP | 2005-82887 | 3/2005 |

OTHER PUBLICATIONS

Wang et al., "Control of Ion Energy Distribution at Substrates During Plasma Processing", Journal of Applied Physics, vol. 88, No. 2, pp. 643-646, (2000).

Chen et al., "Fluid Modeling of Electron Heating in Low-Pressure, High-Frequency Capacitively Coupled Plasma Discharges", Journal of Applied Physics, vol. 96, No. 11, pp. 6073-6081, (2004).

Office Action issued by the Korean Patent Office on Aug. 27, 2008, for Korean Patent Application No. 10-2007-0069246, and English-language Summary thereof.

The First Office Action issued by the Chinese Patent Office on Aug. 25, 2010, for Chinese Patent Application No. 200710148832.8, and English-language translation thereof.

\* cited by examiner

*Primary Examiner*—Duy-Vu N Deo
(74) *Attorney, Agent, or Firm*—Finnegan, Henderson, Farabow, Garrett & Dunner, L.L.P.

(57) ABSTRACT

A substrate plasma processing apparatus includes a chamber of which an interior is evacuated under a predetermined vacuum condition; an RF electrode which is disposed in the chamber and configured so as to hold a substrate to be processed on a main surface thereof; an opposing electrode which is disposed opposite to the RF electrode in the chamber; an RF voltage applying device for applying an RF voltage with a predetermined frequency to the RF electrode; and a pulsed voltage applying device for applying a pulsed voltage to the RF electrode so as to be superimposed with the RF voltage.

10 Claims, 10 Drawing Sheets

METHOD FOR PLASMA PROCESSING A SUBSTRATE

CROSS-REFERENCE TO THE INVENTION

This application is based upon and claims the benefit of priority from the prior Japanese Patent Application No. 2006-237012, filed on Aug. 31, 2006; the entire contents of which are incorporated herein by reference.

BACKGROUND OF THE INVENTION

1. Field of the Invention

The present invention relates to a so-called parallel plate type plasma processing apparatus configured such that the RF electrode is disposed opposite to the opposing electrode and a substrate positioned on the RF electrode is processed by means of plasma which is generated between the RF electrode and the opposing electrode, and to a plasma processing method using the plasma processing apparatus.

2. Description of the Related Art

In the wiring for a substrate such as a semiconductor wafer, it is required that the fine processing is carried out for the substrate before the wiring, and conventionally, in this point of view, a processing apparatus utilizing plasma is often employed for the fine processing.

In the conventional plasma processing apparatus, the high frequency (RF) electrode is disposed opposite to the opposing electrode in the vacuum chamber of which the interior is evacuated in vacuum condition. The substrate to be processed is held on the main surface of the RF electrode which is opposite to the opposing electrode so that the conventional plasma processing apparatus can constitute a parallel plate type plasma processing apparatus. A processing gas to generate the plasma and thus, process the substrate is introduced into the chamber through a gas conduit under a predetermined pressure by vacuum-evacuating the chamber with a vacuum pump through an exhaust line.

Then, a predetermined RF voltage is applied to the RF electrode from a commercial RF power source to generate a high frequency wave of 13.56 MHz so that the intended plasma can be generated between the RF electrode and the opposing electrode.

In this case, since the RF electrode (substrate) is charged negatively so as to be self-biased negatively (the amplitude of the electric potential: Vdc), positive ions are incident onto the substrate at high velocity by means of the negative self-bias of Vdc. As a result, the surface reaction of the substrate is induced by utilizing the substrate incident energy of the positive ions, thereby conducting an intended plasma substrate processing such as reactive ion etching (RIE), CVD (Chemical vapor Deposition), sputtering, ion implantation. Particularly, in view of the processing for the substrate, the RIE can be mainly employed as the plasma substrate processing. Therefore, the RIE processing will be mainly described hereinafter.

In the above-described plasma processing apparatus, since the Vdc (the average substrate incident energy of the positive ions) is increased as the RF power is increased, the RF power is controlled so as to adjust the Vdc for the appropriate processing rate and the shape-forming processing. The Vdc can be adjusted by controlling the pressure in the chamber and the shape of the RF electrode and/or the opposing electrode.

In the above-described plasma processing apparatus, the ion energy in the plasma generated in the chamber is divided into a lower energy side peak and a higher energy side peak so that the energy difference ($\Delta E$) between the peaks becomes within a range of several ten (eV) to several hundred (eV). Therefore, even though the Vdc is adjusted appropriately, some of the ions incident onto the substrate are belonged to the higher energy range and the other of the ions incident onto the substrate are belonged to the lower energy range so that the ions with the higher energy coexist with the ions with the lower energy.

In the plasma substrate processing such as the RIE, in this point of view, the processing shape of the substrate may be deteriorated because some corners of the substrate are flawed by the ions with the higher energy. Moreover, if the ions with the lower energy are employed, the substrate processing may not be conducted because the ion energy becomes below the surface reaction threshold energy or the processing shape of the substrate may be also deteriorated due to the reduction in the processing anisotropy which is originated from that the incident angle range of the ions are enlarged because the thermal velocity of each ion is different from another one.

Recently, semiconductor devices are much downsized so that the films or complex films composing the semiconductor devices are finely processed. Therefore, the processing technique such as the RIE is required to be finely controlled by narrowing the ion energy range (realizing a smaller $\Delta E$) and controlling the average substrate incident energy (Vdc) appropriately.

In order to narrow the ion energy range, it is considered that the intended plasma is generated by developing the frequency of the high frequency wave (refer to JP-A 2003-234331 (KOKAI)) or by utilizing a pulsed wave (refer to J. Appl. Phys. Vol. 88, No. 2, 643 (2000)).

The plasma generation can be mainly classified as inductive coupling type plasma generation and capacity coupling type plasma generation. In view of the fine control for the processing shape, it is effective that the plasma volume is decreased so that the plasma retention time can be shortened, thereby reducing the byproduct reaction. As a result, the capacity coupling plasma generation is effective for the fine control for the processing shape in comparison with the inductive coupling plasma generation because the capacity coupling plasma generation can generate only a plasma with a smaller volume than the inductive coupling plasma generation.

It is also considered that two high frequency waves with the respective different frequencies are applied to the RF electrode so that the plasma density can be controlled by the high frequency wave with a higher frequency of e.g., 100 MHz and the Vdc can be controlled by the high frequency wave with a lower frequency of e.g., 3 MHz (refer to JP-A 2003-234331 (KOKAI)). In this case, the plasma density and the Vdc can be finely controlled. Then, two sets of high frequency power sources and matching boxes are prepared for the high frequency waves with the higher frequency and the lower frequency, respectively, so that the high frequency wave with the higher frequency can be superimposed with the high frequency wave with the lower frequency.

In view of the cleaning process and the processing stability, it is desired that the opposing electrode is electrically grounded. If the RF voltage is applied to the opposing electrode, the opposing electrode may be eroded due to the self bias of Vdc applied to the opposing electrode, thereby creating some dusts and render the processing condition unstable. In this point of view, as described above, the two high frequency waves are applied to the RF electrode under the superimposing condition.

[Document No. 1] JP-A 2003-234331 (KOKAI)
[Document No. 2] G. Chen, L. L. Raja, J. Appl. Phys. 96, 6073 (2004)
[Document No. 3] J. Appl. Phys. Vol. 88, No. 2, 643 (2000)

Such a high frequency technique as examining for ion energy range narrowing is effective for the narrowing of the energy difference ΔE because ions can not follow the electric field from the high frequency wave, but not effective for the enhancement of the Vdc because the absolute value of the Vdc becomes small. For example, if a high frequency wave with a frequency of 100 MHz and an electric power of 2.5 kW is employed (under the condition that the diameter of the susceptor is set to 300 mm, and the pressure in the chamber is set to 50 mTorr using Ar gas), the absolute value of the Vdc is lowered than the Vdc threshold value (about 70 eV) of oxide film or nitride film. Therefore, even though the oxide film and the nitride film is plasma-processed under the condition that the Vdc is lowered than the threshold value, the oxide film and the nitride film can be processed at an extremely processing rate, which can not be practically employed.

On the other hand, if the average substrate incident energy of the positive ions (Vdc) is increased by increasing the RF power, the energy difference ΔE can not be reduced because the Vdc is proportion to the energy difference ΔE during the control of the average substrate incident energy (Vdc) with the RF power. Moreover, the RF power of about 7 kW is required so as to realize the Vdc of 100V at 100 MHz, which becomes difficult because it is difficult to bring out such a large RF power from a commercially available RF power source with a maximum power within a range of 5 to 10 kW. As a result, the high frequency technique can be applied for such a plasma processing as requiring a lower surface reaction threshold energy, but may not be applied for such a plasma processing as requiring a higher surface reaction threshold energy (70 eV or over) because it is difficult to control the Vdc commensurate with the plasma processing.

In the use of the two high frequency superimposed waves, since the energy difference ΔE is enlarged because the ion energy in the plasma is divided into the lower energy side peak and the higher energy side peak, the energy difference ΔE can not be narrowed.

In the use of the pulsed wave technique, since the ion energy in the plasma is directly controlled by means of the periodically DC voltage, it is advantageous for the ion energy range narrowing and the ion energy control. In this technique, however, since the plasma may be rendered unstable because the applying voltage is remarkably decreased and the plasma density is decreased at DC voltage off-state, and the large current is generated in the plasma when the DC voltage is also applied. Particularly, when an insulator formed on the substrate is plasma-processed, the surface electric charge on the insulator can not be discharged effectively during one period of the DC pulse so that the plasma is rendered unstable and thus, diminished. Moreover, since the large current is generated intermittently in the plasma, the device under fabrication may be electrically damaged, so that a stable parallel plate type pulsed plasma can not be generated.

SUMMARY OF THE INVENTION

It is an object of the present invention, in view of the above-described problems, to provide a parallel plate type substrate plasma processing apparatus wherein the RF electrode is disposed opposite to the opposing electrode in a vacuum chamber so as to generate a plasma with an energy suitable for the substrate processing and a smaller ion energy range enough to process the substrate finely. It is an object of the present invention to provide a substrate plasma processing method utilizing the substrate plasma processing apparatus.

In order to achieve the above object, an aspect of the present invention relates to a substrate plasma processing apparatus comprises: a chamber of which an interior is evacuated under a predetermined vacuum condition; an RF electrode which is disposed in the chamber and configured so as to hold a substrate to be processed on a main surface thereof; an opposing electrode which is disposed opposite to the RF electrode in the chamber; an RF voltage applying device for applying an RF voltage with a predetermined frequency to the RF electrode; and a pulsed voltage applying device for applying a pulsed voltage to the RF electrode so as to be superimposed with the RF voltage.

Another aspect of the present invention relates to a substrate plasma processing method comprises: holding a substrate to be processed on a main surface of an RF electrode which is disposed opposite to an opposing electrode in a chamber of which an interior is evacuated under a predetermined vacuum condition; applying an RF voltage with a predetermined frequency to the RF electrode; and applying a pulsed voltage to the RF electrode so as to be superimposed with the RF voltage.

In the aspects of the present invention, the pulsed voltage is applied to the RF electrode in addition to the RF voltage. In this case, the pulsed voltage is super imposed with the RF voltage. Therefore, if the pulse width t1, the period t2 and the voltage value $V_{pulse}$ of the pulsed voltage, and the like are varied, the lower energy side peak can be shifted in an energy range smaller enough not to affect the substrate processing than the energy range of the higher energy side peak or can be in the vicinity of the higher energy side peak.

In the former case, if the energy value of the higher energy side peak is controlled appropriately, the substrate processing can be conducted only by using the ions within the higher energy range peak. That is, if the energy value of the higher energy side peak is optimized and the inherent narrowed energy range characteristic is utilized, the substrate processing can be conducted finely (First processing method).

In the latter case, the lower energy side peak and the higher energy side peak can be shifted in the vicinity of one another so as to be combined with one another, thereby forming narrow energy band. As a result, if the energy range of the one combined energy peak, and the vicinity between the lower energy side peak and the higher, i.e., the narrowing degree of the one combined energy peak are optimized, the substrate processing can be conducted finely by using the ions within the one combined energy peak (Second processing method).

As described above, according to the present invention, it can be provided a parallel plate type substrate plasma processing apparatus wherein the RF electrode is disposed opposite to the opposing electrode in a vacuum chamber so as to generate a plasma with an energy suitable for the substrate processing and a smaller ion energy range enough to process the substrate finely. Also, according to the present invention, it can be provided a substrate plasma processing method utilizing the substrate plasma processing apparatus.

DESCRIPTION OF THE EMBODIMENTS

Figure 1:
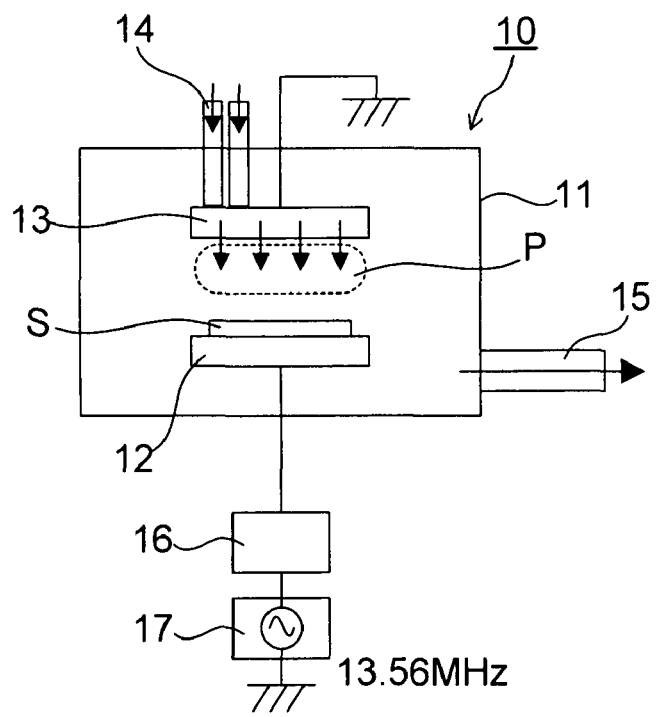
FIG. 1 is a structural view schematically illustrating a conventional substrate plasma processing apparatus (Comparative Embodiment).

Hereinafter, the present invention will be described in detail with reference to the drawings.

In an embodiment, the frequency $\omega rf/2\pi$ of the RF voltage, which is applied to the RF electrode from the pulsed voltage applying device, is set to 50 MHz or over, and the pulsed voltage applying device includes a controller for controlling at least a pulse width t1 (s) and a voltage value $V_{pulse}$ of the pulsed voltage so that the relation of $t1 \geq 2\pi/(\omega p/5)$ is satisfied (herein, $\omega p$ is a plasma ion frequency and represented as $\omega p=(e^2 N_0/\epsilon_0 Mi)^{1/2}$; e: elementary charge, $\epsilon_0$: vacuum dielectric constant, Mi: ion mass (kg), $N_0$: plasma density ($/m^3$)), and the relation of $|V_{p-p}|<|V_{pulse}|$ is satisfied (herein, $V_{p-p}$ is a voltage value of the RF voltage). In this case, the first processing method can be conducted simply under good condition.

In another embodiment, the frequency $\omega rf/2\pi$ the RF voltage, which is applied to the RF electrode from the pulsed voltage applying device, is set to 50 MHz or over, and the pulsed voltage applying device includes a controller for controlling at least a pulse width t1 (s) and a period t2 of the pulsed voltage so that the relation of $2\pi/\omega rf<t1<t2<2\pi(\omega p/5)$ is satisfied (herein, $\omega p$ is a plasma ion frequency and represented as $\omega p=(e^2 N_0/\epsilon_0 Mi)^{1/2}$; e: elementary charge, $\epsilon_0$: vacuum dielectric constant, Mi: ion mass (kg), $N_0$: plasma density ($/m^3$)). In this case, the second processing method can be conducted simply under good condition.

In these embodiments, the reason of the frequency ($\omega rf/2\pi$) of the RF voltage to be applied to the RF electrode from the RF applying device being set to 50 MHz or over is that the Vdc (average substrate incident ion energy), originated from the RF voltage, is lowered enough not to affect the substrate processing. Moreover, the reason of the RF voltage being constantly applied to the RF electrode is that the plasma to be used for the substrate processing can be generated effectively and efficiently, thereby realizing the intended substrate processing even though an insulating film is formed on the substrate.

In these aspects, in this point of view, the substrate processing is mainly carried out by the pulsed voltage superimposed with the RF voltage.

The energy difference ΔEi between the lower energy side peak and the higher energy side peak of the ion energy to be incident onto the substrate is decreased as the frequency of the RF voltage is increased. Therefore, if the frequency of the RF voltage is increased, particularly to 50 MHz or over, the lower energy side peak and the higher energy side peak can be shifted in the vicinity of one another so that the energy difference ΔEi can be narrowed. In this case, it is considered that the lower energy side peak is combined with the higher energy side peak, thereby forming one energy peak, so that the intended substrate processing can be carried out by using the ions within an energy range of the combined energy peak.

In an embodiment, the pulsed voltage may be rendered a negative pulsed voltage. Generally, when an intended plasma is generated by means of the application of RF voltage to an RF electrode, the potential of the RF electrode is rendered negative by means of self-bias principle. Therefore, the ions in the vicinity of the RF electrode are affected by the periodical voltage (RF voltage) of which the voltage value is shifted negative, thereby conducting the substrate processing through the collision of the ions against the substrate by utilizing the RF voltage as an accelerating voltage. In this point of view, if the pulsed voltage is rendered a positive pulsed voltage, the RF voltage shifted negative may be partially cancelled by the positive pulsed voltage so that it may be that the positive ions can not be accelerated by the RF voltage.

As a result, if the pulsed voltage may be rendered the negative pulsed voltage, the above-described disadvantage can be removed.

The RF voltage applying device may include a high-pass filter to pass the RF voltage and shut off the pulsed voltage. In this case, it is prevented that the pulsed voltage is applied to the RF voltage applying device so as to deteriorate the operational ability of the RF voltage applying device and render the RF voltage applying device malfunction.

In an embodiment, an ion energy detecting device may be provided for monitoring an energy state of ions at least located between the RF electrode and the opposing electrode. Therefore, when it is required to vary at least one of the substrate incident ion energy and the ion energy range in the plasma in accordance with the processing stage or processing switching by controlling at least one selected from the group consisting of the frequency $\omega rf/2\pi$ and the voltage value $V_{p-p}$ of the RF voltage, and the pulse width t1, the period t2, the pulsed voltage value $V_{pulse}$ of the pulsed voltage, the energy condition of the ions in the plasma can be monitored successively.

Since the change of the ion energy state which depends on some parameters such as the frequency $\omega rf/2\pi$ of the RF voltage can be detected immediately, the desired ion energy state can be generated immediately by adjusting the parameters.

In the present specification, the "RF applying device" may include an RF generator and an impedance matching box which are known by the person skilled in the art. Moreover, the RF applying device may include an amplifier as occasion demands.

In the present specification, the "pulse applying device" may include an amplifier, a low-pass filter in addition to a pulse generator which is known by the person skilled in the art.

In view of the additional aspects as described above, a substrate plasma processing apparatus and a substrate plasma processing method according to the present invention will be described hereinafter, in comparison with a conventional substrate plasma processing apparatus and method.

Comparative Embodiment Utilizing a Substrate Plasma Processing Apparatus

FIG. 1 is a structural view schematically illustrating a conventional substrate plasma processing apparatus in Comparative Embodiment.

In a substrate plasma processing apparatus 10 illustrated in FIG. 1, an high frequency (RF) electrode 12 is disposed opposite to an opposing electrode 13 in a vacuum chamber 11 of which the interior is evacuated under a predetermined degree of vacuum. A substrate S to be processed is positioned on the main surface of the RF electrode 12 which is opposite to the opposing electrode 13. As a result, the substrate plasma processing apparatus 10 constitutes a so-called parallel plate type plasma processing apparatus. A gas for generating plasma and thus, processing the substrate S is introduced in the chamber 11 through a gas conduit 14 designated by the arrows. The interior of the chamber 11 is also evacuated by a vacuum pump (not shown) so that the interior of the chamber 11 can be maintained in a predetermined pressure under the vacuum condition. For example, the interior of the chamber 11 may be set to about 1 Pa.

Then, a predetermined RF voltage is applied to the RF electrode 12 from a commercial RF power source 17 to generate a high frequency wave of 13.56 MHz via a matching box 16 so that the intended plasma P can be generated between the RF electrode 12 and the opposing electrode 13.

In this case, since the RF electrode 12 is charged negatively so as to be self-biased negatively (the amplitude of the electric potential: Vdc), the positive ions in the plasma are incident onto the substrate S positioned on the RF electrode 12 at high velocity by means of the negative self-bias of Vdc. As a result, the surface reaction of the substrate S is induced by utilizing the substrate incident energy of the positive ions, thereby conducting an intended plasma substrate processing such as reactive ion etching (RIE), CVD (Chemical vapor Deposition), sputtering, ion implantation. Particularly, in view of the processing for the substrate, the RIE can be mainly employed as the plasma substrate processing. Therefore, the RIE processing will be mainly described hereinafter.

Figure 2:
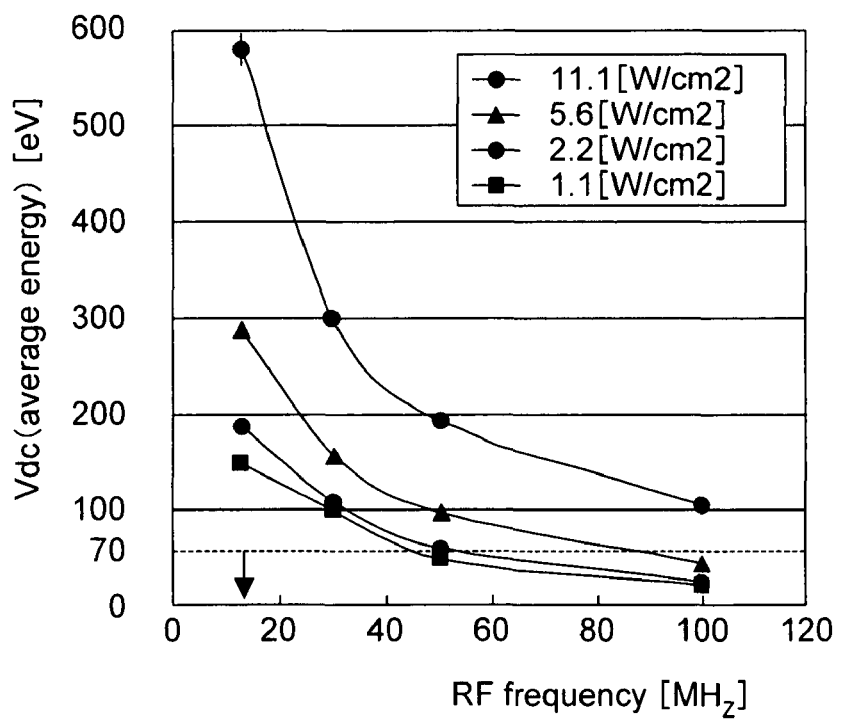
FIG. 2 is a graph showing the relation between the RF power and the Vdc (average substrate incident ion energy) in the conventional apparatus illustrated in FIG. 1.

In the plasma processing apparatus 10 illustrated in FIG. 1, since the Vdc (the average substrate incident energy of the positive ions) is increased as the RF power is increased, as shown in FIG. 2, the RF power is controlled so as to adjust the Vdc for the appropriate processing rate and the shape-forming processing. The Vdc can be adjusted by controlling the pressure in the chamber and the shape of the RF electrode 12 and/or the opposing electrode 13.

Figure 3:
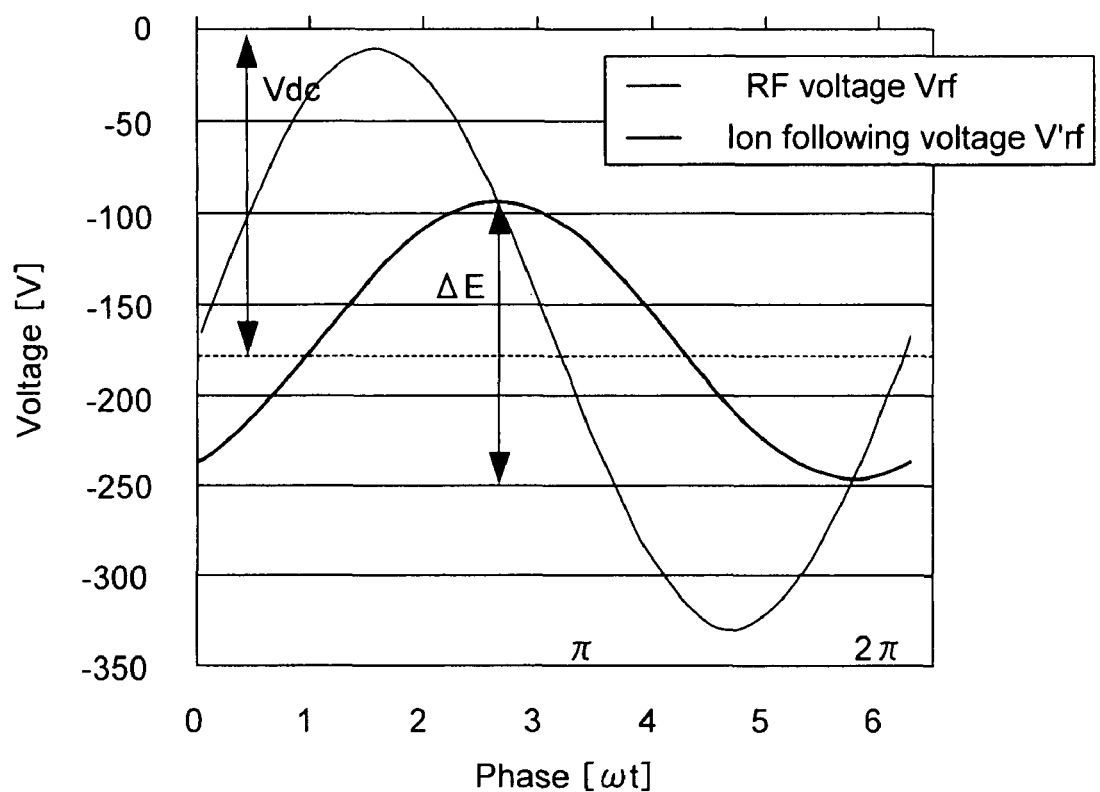
FIG. 3 is a graph representing the characteristics of a plasma originated from the simulation on the basis of the continuum modeled plasma simulator.
Figure 4:
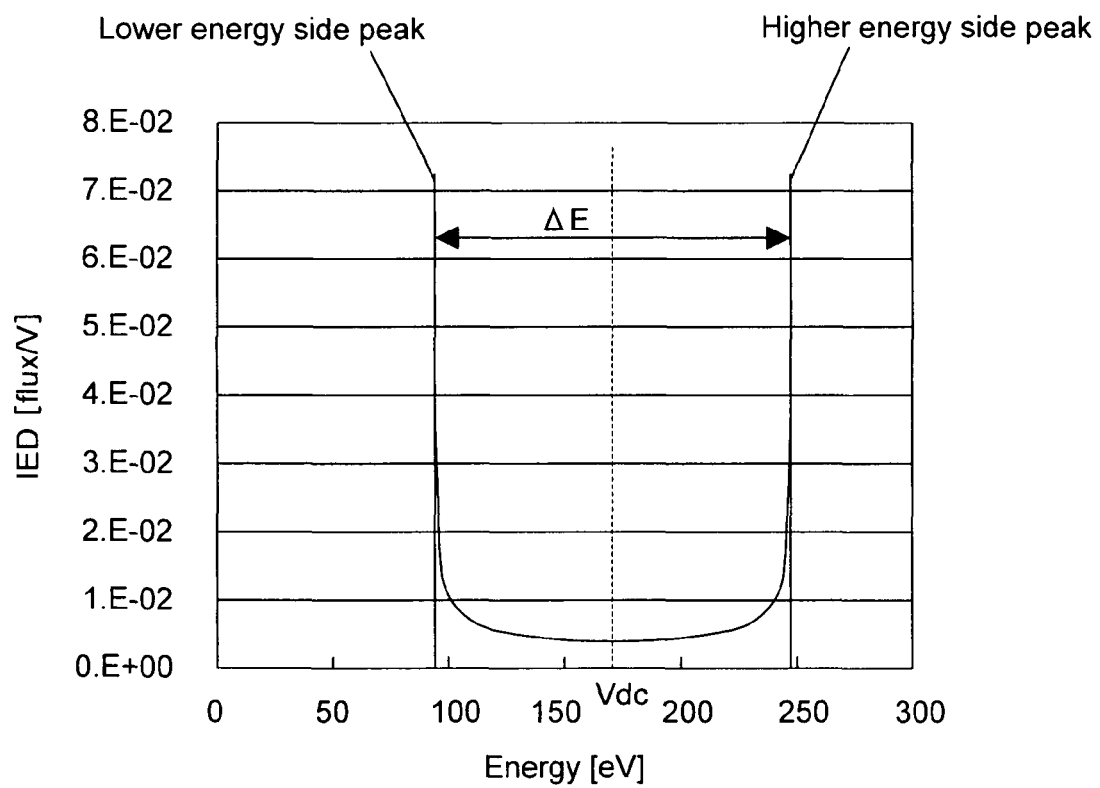
FIG. 4 is a graph representing the energy range distribution of the plasma originated from the simulation on the basis of the continuum modeled plasma simulator.
Figure 5:
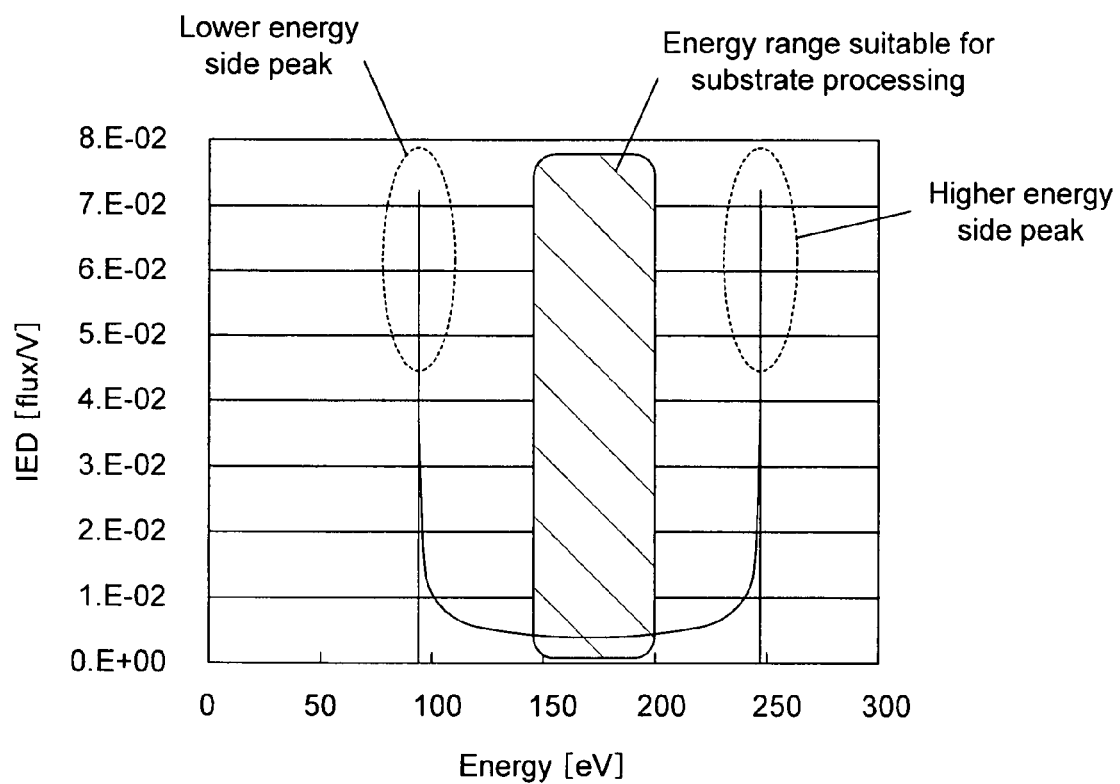
FIG. 5 is a graph showing an ion energy distribution suitable for the substrate processing.

FIGS. 3 and 4 are graphs representing the characteristics of a plasma originated from the simulation on the basis of the continuum modeled plasma simulator (refer to, G. Chen, L. L. Raja, J. Appl. Phys. 96, 6073 (2004)) under the condition that the Ar gas pressure is set to 50 mTorr and the distance between the electrodes is set to 30 mm and the wafer size is set to 300 mm, and the frequency of the high frequency wave is set to 3 MHz and a Vrf of 160 V is employed. FIG. 5 is a graph showing an ion energy distribution suitable for the substrate processing.

As shown in FIG. 3, since the RF electrode potential is periodically varied, the substrate incident ion energy is also periodically varied. However, since the substrate incident ion energy follows the RF electrode potential behind time due to the ion mass, the amplitude Vrf' of the substrate incident ion energy becomes smaller than the amplitude Vrf of the RE electrode potential. The substrate incident ion energy depends properly on the Vdc and the plasma potential Vp, but since the absolute value and time variation of the Vp are extremely small, the detail explanation for the Vp is omitted in the present specification and the depiction of the Vp is omitted in FIG. 3. As a result, the incident ion energy for the substrate S can be represented as in FIG. 4 by integrating the incident ion energy variation shown in FIG. 3 with time.

As is apparent from FIG. 4, the incident ion energy in the plasma generated in the chamber 11 illustrated in FIG. 1 is divided into the lower energy side peak and the higher energy side peak so that the energy difference ΔE between the peaks can be set within several ten (eV) to several hundred (eV) in dependent on the plasma generating condition. Even though the Vdc is controlled suitable for the intended substrate processing, therefore, with the substrate incident ions, the ions within a higher energy range (higher energy side peak) coexists with the ions within a lower energy range (lower energy side peak), as shown in FIG. 5.

In the plasma substrate processing such as the RIE, in this point of view, the processing shape of the substrate S may be deteriorated because some corners of the substrate S are flawed by the ions with the higher energy. Moreover, if the ions with the lower energy are employed, the substrate processing may not be conducted because the ion energy becomes below the surface reaction threshold energy or the processing shape of the substrate may be also deteriorated due to the reduction in the processing anisotropy which is originated from that the incident angle range of the ions are enlarged by thermal motion of ions.

Embodiment Utilizing a Substrate Plasma Processing Apparatus

Figure 6:
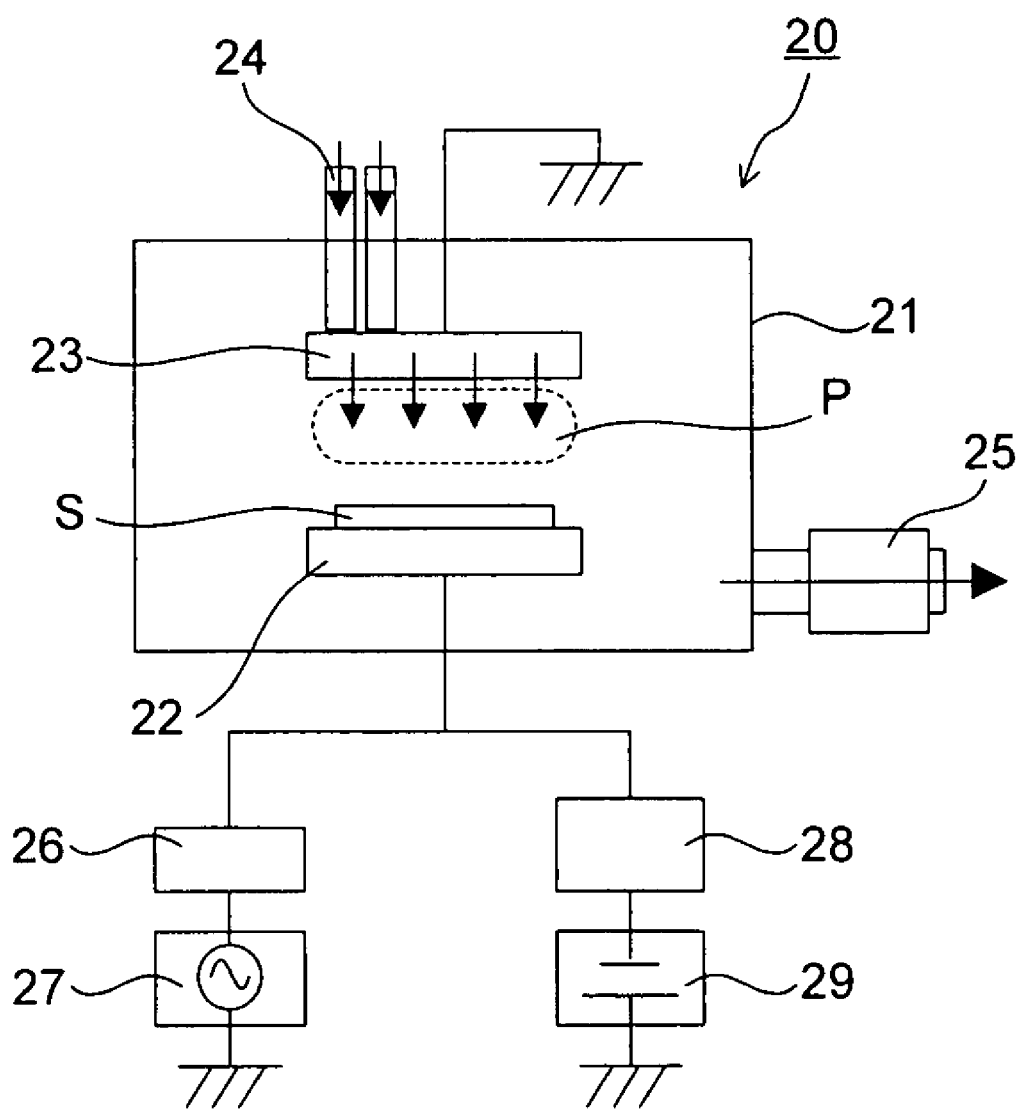
FIG. 6 is a structural view schematically illustrating a substrate plasma processing apparatus according to an embodiment.
Figure 7:
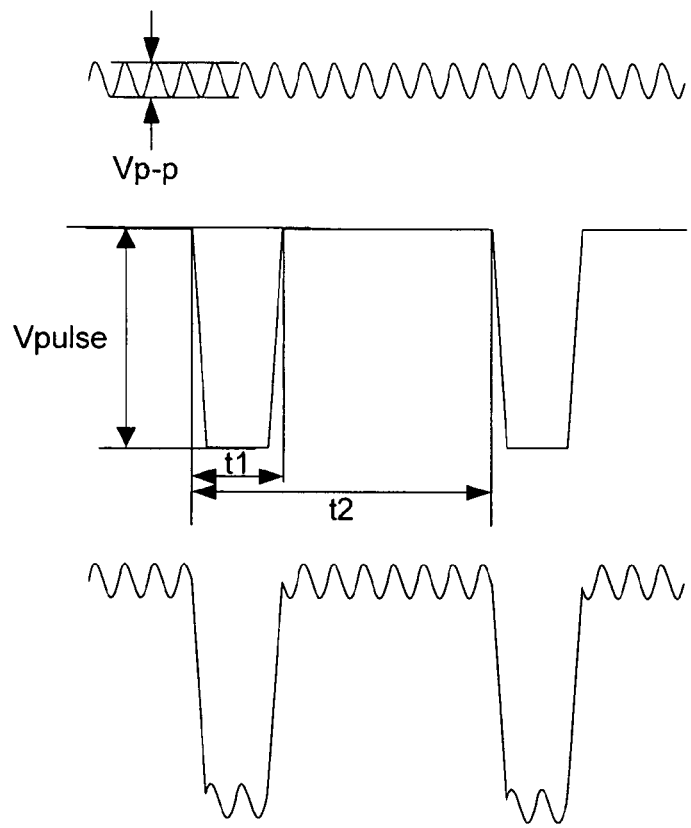
FIG. 7 is a schematic view illustrating the waveform of a superimposed high frequency wave to be applied as a voltage to the RF electrode of the apparatus illustrated in FIG. 6.

FIG. 6 is a structural view schematically illustrating a substrate plasma processing apparatus according to an embodiment. FIG. 7 is a schematic view illustrating the waveform of a superimposed high frequency wave to be applied as a voltage to the RF electrode of the apparatus illustrated in FIG. 6. The RIE processing will be mainly described hereinafter as a plasma processing method utilizing the plasma processing apparatus illustrated in FIG. 6.

In a substrate plasma processing apparatus 20 illustrated in FIG. 6, an high frequency (RF) electrode 22 is disposed opposite to an opposing electrode 23 in a vacuum chamber 21 of which the interior is evacuated under a predetermined degree of vacuum. A substrate S to be processed is positioned on the main surface of the RF electrode 22 which is opposite to the opposing electrode 23. As a result, the substrate plasma processing apparatus 20 constitutes a so-called parallel plate type plasma processing apparatus. A gas for generating plasma and thus, processing the substrate S is introduced in the chamber 21 through the gas conduit 24 designated by the arrows. The interior of the chamber 21 is also evacuated by a vacuum pump (not shown) through an exhaust line 25 so that the interior of the chamber 11 can be maintained in a predetermined pressure under the vacuum condition.

As the gas, such a gas as Ar, Kr, Xe, $N_2$, $O_2$, CO, $H_2$ can be employed, and more, such a processing gas as $SF_6$, $CF_4$, $C_2F_6$, $C_4F_8$, $C_5F_8$, $C_4F_6$, $Cl_2$, HBr, $SiH_4$, $SiF_4$ can be employed. The pressure in the chamber 21 may be appropriately set in accordance with the processing rate for the substrate S and the kind of gas to be used.

Then, an RF voltage is applied to the RF electrode 22 from an RF power source 27 via a matching box 26 while a pulsed voltage is applied to the RF electrode 22 from a pulsed voltage power source 29 via a low-pass filter 28. In this case, the RF voltage and the pulsed voltage are superimposed and thus, applied to the RF electrode 22, as shown in FIG. 7, so that a plasma P can be generated between the RF electrode 22 and the opposing electrode 23. The positive ions in the plasma P is accelerated by the negative self-bias voltage (the average substrate incident ion energy can be represented by "Vdc") of the RF electrode 22, and thus, incident onto the substrate S so as to be processed.

The RF voltage power source 27 and the pulsed voltage power source 29 may include the respective amplifiers to amplify the RF voltage and the pulsed voltage therein.

It is desired that the pulsed voltage can be rendered a negative pulsed voltage. As described above, the positive ions in the plasma P is accelerated at high velocity by the negative self-bias voltage of the RF electrode 22, and thus, incident onto the substrate S so as to be processed. Not particularly shown in FIG. 7, the RF voltage is periodically varied in a negative voltage range due to the self-bias voltage, as shown in FIG. 3. Therefore, if the pulsed voltage is rendered a positive pulsed voltage, the amplitude of the RF voltage may be partially cancelled by the amplitude of the pulsed voltage, so that the intended accelerating voltage can not be generated and thus, the positive ions can not be accelerated sufficiently.

As a result, if the pulsed voltage may be rendered the negative pulsed voltage, the above-described disadvantage can be removed.

Figure 8:
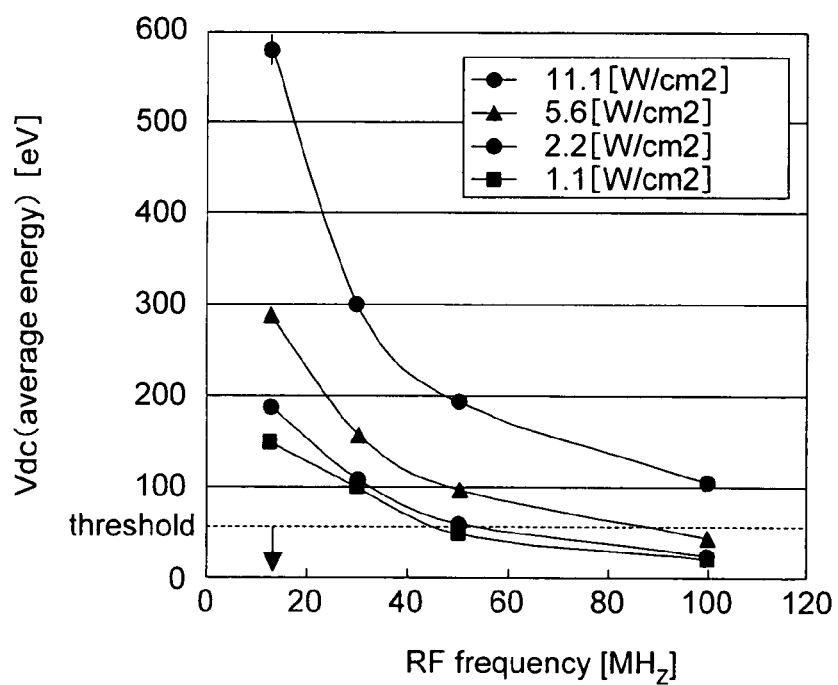
FIG. 8 shows a graph showing the relation between the Vdc (average substrate incident ion energy) and the RF frequency in the apparatus illustrated in FIG. 6.
Figure 9:
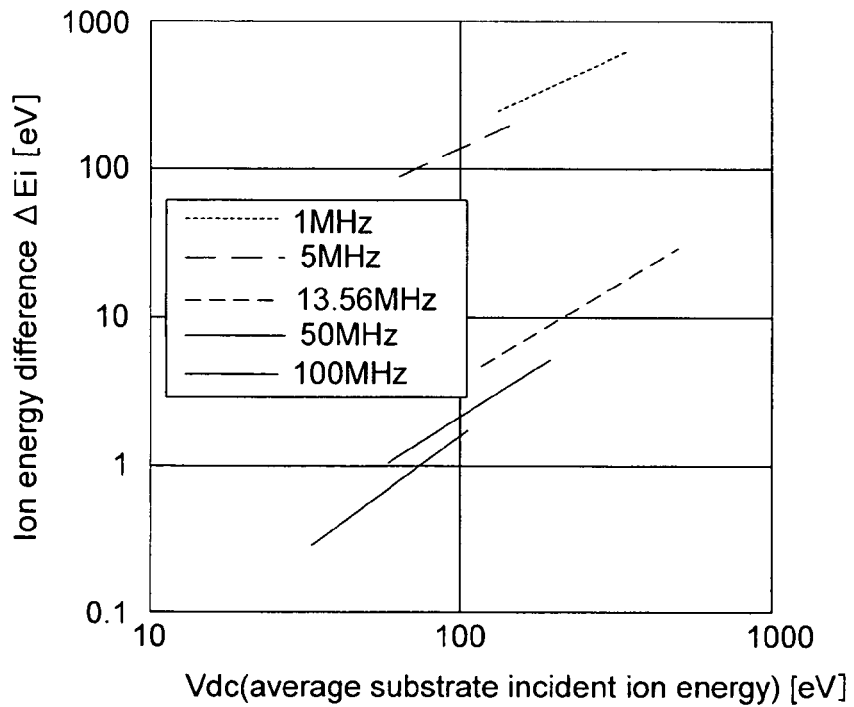
FIG. 9 shows a graph showing the relation between the energy difference ΔEi and the Vdc (average substrate incident ion energy).

FIG. 8 shows a graph showing the relation between the Vdc (average substrate incident ion energy) and the RF frequency in the apparatus illustrated in FIG. 6. FIG. 9 shows a graph showing the relation between the energy difference $\Delta Ei$ and the Vdc (average incident ion energy). The graph shown in FIG. 8 is the same as the graph shown in FIG. 2.

As is apparent from FIG. 8, the Vdc (average substrate incident ion energy) is decreased as the frequency of the RF voltage to be applied to the RF electrode 22 is increased. Particularly, if the RF power is set to 2.2 W/cm² or below, the RF power is decreased to about a threshold value of 50 eV or below which can not affect the substrate processing when the frequency of the RF voltage is increased to 50 MHz or over. Moreover, if the RF power is set beyond 2.2 W/cm², the dependency of the Vdc on the frequency of the RF power becomes extremely small when the frequency of the RF voltage is increased beyond 50 MHz. If the frequency of the RF voltage is set to 50 MHz or over, therefore, it is apparent that the RF voltage can not affect the substrate processing, but only the (negative) pulsed voltage can affect the substrate processing.

In other words, since the substrate processing can be carried out by controlling the (negative) pulsed voltage, the operation for the substrate processing can be simplified so that the operationality of the substrate processing can be developed.

In this embodiment, the constant application of the RF voltage to the RF electrode is directed mainly at the effective and efficient plasma generation and thus, conducting the substrate processing even though an insulating film is formed on the substrate S.

As is apparent from FIG. 9, the energy difference $\Delta Ei$ between the higher energy side peak and the lower energy side peak as shown in FIG. 4 is decreased as the frequency of the RF voltage is increased under the same Vdc condition. As a result, it is advantage to increase the frequency of the RF voltage, e.g., to 50 MHz or over because the lower energy side peak and the higher energy side peak can be shifted in the vicinity of one another so that the energy difference $\Delta Ei$ can be narrowed. In this case, it is considered that the lower energy side peak is combined with the higher energy side peak, thereby forming one energy peak, so that the intended substrate processing can be carried out by using the ions within an energy range of the combined energy peak.

With a controller (not shown) built in the pulsed voltage power source 29, the pulse width t1 (s) and the pulse voltage value $V_{pulse}$ (V) of the pulsed voltage generated from the pulsed voltage power source 29 are controlled so that the relation of $t1 \geq 2\pi/(\omega p/5)$ is satisfied (herein, $\omega p$ is a plasma ion frequency and represented as $\omega p = (e^2 N_0/\epsilon_0 Mi)^{1/2}$; e: elementary charge, $\epsilon_0$: vacuum dielectric constant, Mi: ion mass (kg), $N_0$: plasma density (/m³)), and the relation of $|V_{p-p}| < |V_{pulse}|$ is satisfied (herein, $V_{p-p}$ is a voltage value of the RF voltage).

In this case, since the positive ions can follow the pulsed voltage, the lower energy side peak can be shifted within an energy range small enough not to affect the substrate processing when the ion energy variation is integrated with time, thereby the ion energy distribution as shown in FIG. 4. Therefore, if the energy range of the higher energy side peak is controlled suitable for the substrate processing, the intended substrate processing can be carried out by using the ions within the higher energy side peak. In other words, if the inherent narrowed energy range of the higher energy side peak is utilized and controlled suitable for the substrate processing, the fine substrate processing can be carried out only by using the ions within the higher energy side peak (First processing method).

Herein, the (absolute) energy value of the higher energy side peak can be controlled by the pulse voltage value $V_{pulse}$ of the pulsed voltage.

With a controller (not shown) built in the pulsed voltage power source 29, the pulse width t1 (s) and the period t2 (s) of the pulsed voltage generated from the pulsed voltage power source 29 are controlled so that the relation of $2\pi/\omega rf < t1 < t2 < 2\pi/(\omega p/5)$ is satisfied (herein, $\omega p$ is a plasma ion frequency and represented as $\omega p = (e^2 N_0/\epsilon_0 Mi)^{1/2}$; e: elementary charge, $\epsilon_0$: vacuum dielectric constant, Mi: ion mass (kg), $N_0$: plasma density (/m³)).

In this case, since the positive ions can not follow the pulsed voltage, the lower energy side peak and the higher energy side peak can be shifted in the vicinity of one another so that the energy difference $\Delta Ei$ can be narrowed when the ion energy variation is integrated with time, thereby the ion energy distribution as shown in FIG. 4. Therefore, it is considered that the lower energy side peak is combined with the higher energy side peak, thereby forming one energy peak.

As a result, if the energy range of the one combined energy peak, and the vicinity between the lower energy side peak and the higher, i.e., the narrowing degree of the one combined energy peak are optimized, the substrate processing can be conducted finely by using the ions within the one combined energy peak (Second processing method). Herein, the (absolute) energy value of the one combined energy side peak can be controlled by the pulse voltage value $V_{pulse}$ and/or duty ratio of the pulsed voltage.

With the plasma etching, e.g., for silicon substrate, a relative large ion energy of about 200 eV is required so as to remove the surface naturally oxidized film, and then, a relatively small ion energy of about 100 eV is preferably required so as to realize the etching process, and then, a much smaller ion energy of about 70 eV is preferably required so as to realize the fine etching process after the stopper such as oxide film is exposed. Such a stepwise ion energy switching can be performed by varying at least one of the pulse width t1, the period t2 and the amplitude of the negative pulsed voltage value $V_{pulse}$.

In the application of the pulsed voltage, a periodical electric charge and discharge process is conducted in the pulsed voltage power source so that the period of the pulsed voltage can not be increased beyond the electric charge duration and the duty ratio of the pulsed voltage has difficulty in being set to 0.5 or over. In this case, at least two pulsed voltage power sources are prepared so as to be connected with one another via a trigger so that the pulsed voltages can be superimposed under the condition that the phases of the pulsed voltages can be shifted from one another. As a result, the period of the resultant superimposed pulsed voltage can be increased beyond the electric charge duration and the duty ratio of the resultant superimposed pulsed voltage can be set to 0.5 or over, which can not be realized by the use of one pulsed voltage power source as described above.

Moreover, if the voltage values $V_{pulse}$ of the pulsed voltages from the pulsed voltage power sources are varied, respectively, the pulsed voltage $V_{pulse}$ of the superimposed pulsed voltage can be rendered stepwise.

Figure 10:
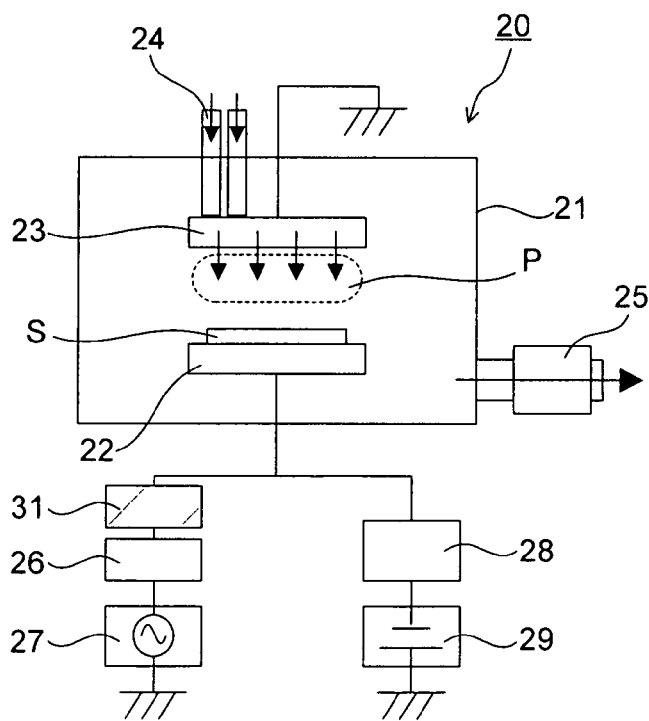
FIG. 10 is a structural view illustrating a modified substrate plasma processing apparatus from the one illustrated in FIG. 6.
Figure 11:
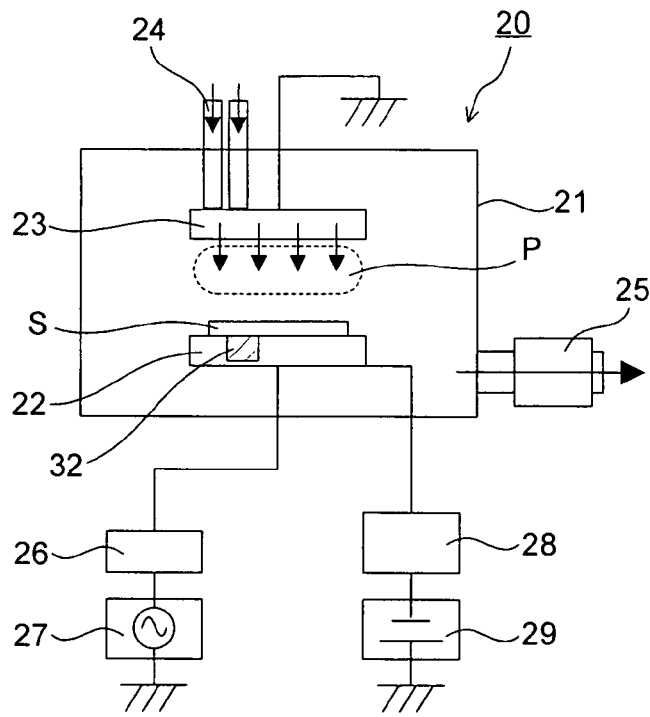
FIG. 11 is a structural view illustrating another modified substrate plasma processing apparatus from the one illustrated in FIG. 6.

FIGS. 10 and 11 are structural views illustrating modified substrate plasma processing apparatuses from the one illustrated in FIG. 6. The plasma processing apparatus illustrated in FIG. 10 is different from the one illustrated in FIG. 6 in that a high-pass filter 31 is provided between the RF electrode 22 and the RE power sources 27. The plasma processing apparatus illustrated in FIG. 11 is different from the one illustrated in FIG. 6 in that an ion energy monitor 32 is built in the RF electrode 22. For simplification, the same reference numerals are imparted to corresponding or like components through FIGS. 6, and 10 to 11.

In the plasma processing apparatus 20 illustrated in FIG. 10, the high-pass filter 31 can pass the RF voltage from the RF voltage power source and shut off the pulsed voltage from the pulsed voltage power source 29. In this case, it is prevented that the pulsed voltage is applied to the RF voltage power source 27 so as to deteriorate the operational ability of the RF voltage power source 27 and render the RF voltage power source 27 malfunction.

In the plasma processing apparatus 20 illustrated in FIG. 11, the ion energy monitor 32 can monitor the energy condition of the ions at least incident onto the RF electrode 22. Therefore, when it is required to vary at least one of the substrate incident ion energy and the ion energy range in the plasma in accordance with the processing stage or processing switching by controlling at least one selected from the group consisting of the frequency $\omega rf/2\pi$ and the voltage value $V_{p-p}$ of the RF voltage, and the pulse width t1, the period t2, the pulsed voltage value $V_{pulse}$ of the pulsed voltage, the energy condition of the ions in the plasma can be monitored successively.

EXAMPLES

The present invention will be concretely described with reference to Example, but the present invention is not limited to Example. Hereinafter, the concrete results are originated from a predetermined simulation.

Example 1

In Example, the concrete operational characteristics relating to the plasma processing apparatus illustrated in FIG. 6 were investigated.

First of all, a $C_4F_8$ gas and an oxygen gas were introduced in the chamber 21 so that the interior of the chamber 21 was set to a pressure within a range of 2 to 200 mTorr. Then, the RF voltage with the voltage value $V_{p-p}$ of 100 V and the frequency of 100 MHz was applied to the RF electrode 22 from the RF power source 27 while the negative pulsed voltage with the voltage value of −500 V and the frequency of 10 MHz was applied to the RF electrode 22 from the pulsed voltage power source 29 so that the RF voltage was super imposed with the pulsed voltage. Since the plasma density $N_0$ of CF ion was $5\times10^{16}$ (/m$^3$), the plasma ion frequency $\omega p/2\pi$ was about 8.4 MHz. Therefore, since the relation of $2\pi/\omega rf < t1 < t2 < 2\pi/(\omega p/5)$ was satisfied for the pulse width t1 and the period t2 of the pulsed voltage, the CF ions were not also able to follow the pulsed voltage in addition to the RF voltage.

Figure 12:
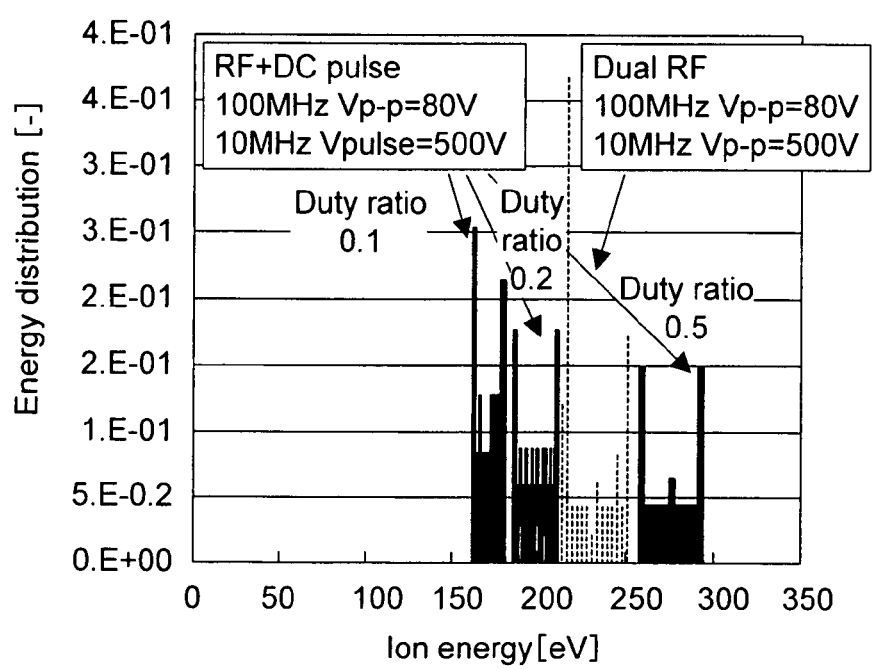
FIG. 12 is a graph showing an ion energy distribution in Examples.
Figure 13:
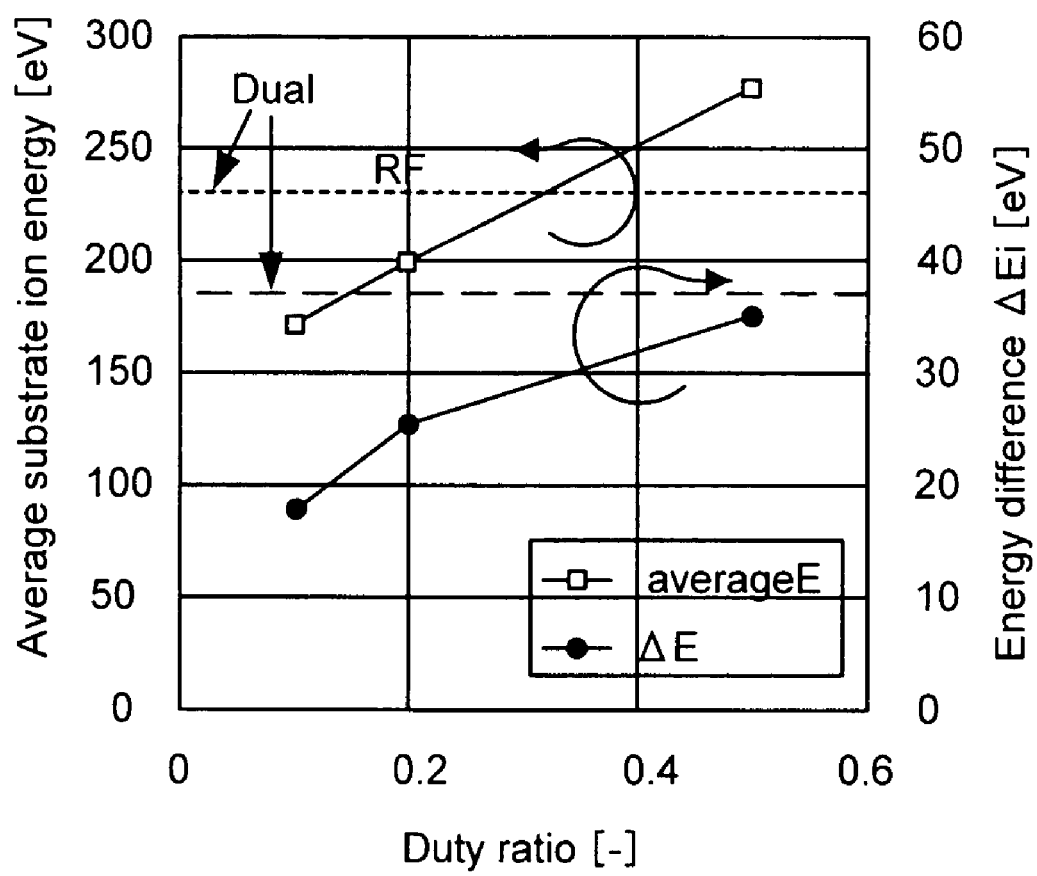
FIG. 13 is a graph showing the relation between the duty ratio of the pulsed voltage and the Vdc (average substrate incident ion energy) in Examples.

As shown in FIGS. 12 and 13, therefore, the resultant ion energy distribution can be narrowed in the case of the application of the negative pulsed voltage than in the case of the application of two RF voltages (dual application of RF voltage). Particularly, the resultant ion energy distribution can be more narrowed as the duty ratio (=t1/t2) of the pulsed voltage is decreased. That is, if the duty ratio is varied, the average ion energy almost proportion to the duty ratio can be also controlled and thus, varied. If the voltage value $V_{pulse}$ of the pulsed voltage is varied, as occasion demands, in the combination with the duty ratio, the average ion energy can be also controlled and thus, varied so as to vary (narrow) the ion energy distribution.

Example 2

In Example, the concrete operational characteristics relating to the plasma processing apparatus illustrated in FIG. 6 were also investigated.

In this Example, the RF voltage with the voltage value $V_{p-p}$ of 80 V and the frequency of 100 MHz was applied to the RF electrode 22 from the RF power source 27 while the negative pulsed voltage with the voltage value of −250 V and the frequency of 1 MHz was applied to the RF electrode 22 from the pulsed voltage power source 29 so that the RF voltage was superimposed with the pulsed voltage. Then, the other conditions were set as defined in Example 1.

Figure 14A:
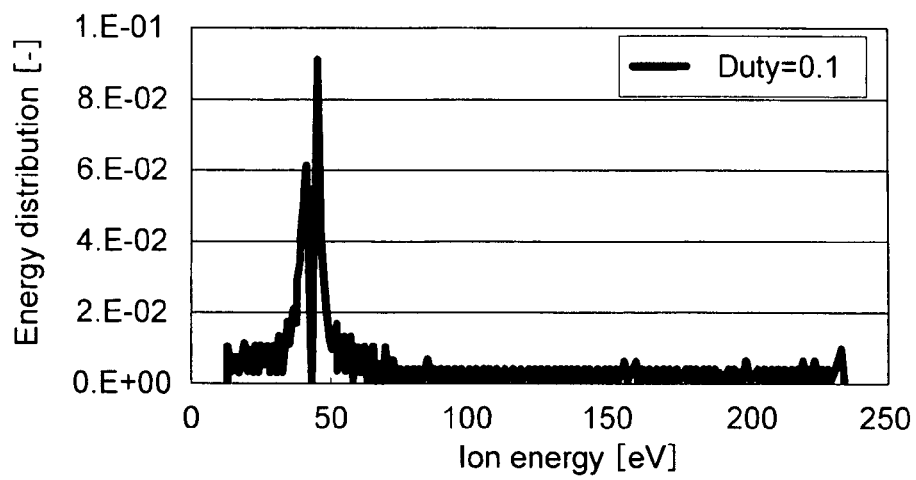
FIG. 14 shows graphs about other ion energy distributions in Examples.
Figure 14B:
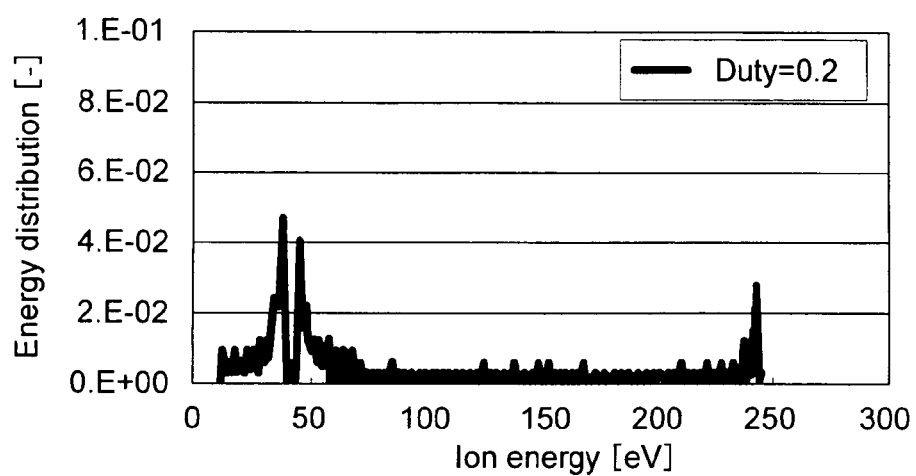
Figure 14C:
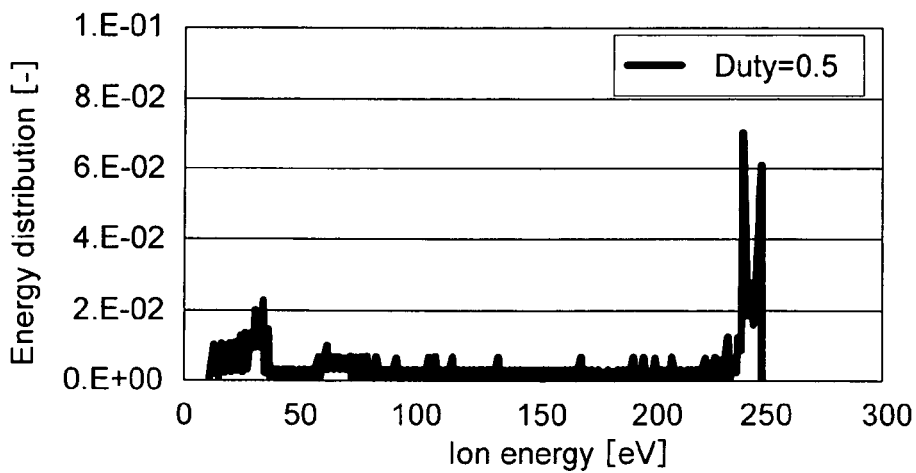

In this Example, since the relation of $t1 \geq 2\pi/(\omega p/5)$ is satisfied, the CF ions can follow the pulsed voltage. As shown in FIG. 14, therefore, the lower energy side peak coexists with the higher energy side peak via a larger energy difference. As shown in FIG. 14, if the duty ratio of the pulsed voltage is increased, the energy distribution density in the higher energy side peak can be increased under the condition that the lower energy side peak coexists with the higher energy side peak via the same energy difference.

The energy value of the higher energy side peak can be adjusted by controlling the voltage value $V_{pulse}$ of the pulsed voltage.

In this Example, since the energy range of the higher energy side peak is narrowed to 8 (eV), the intended fine processing can be realized by using the ions within the energy range.

Although the present invention was described in detail with reference to the above examples, this invention is not limited to the above disclosure and every kind of variation and modification may be made without departing from the scope of the present invention.

In these embodiments, for example, the plasma processing apparatus and method of the present invention is directed mainly at RIE technique, but may be applied for another processing technique.

What is claimed is:

1. A substrate plasma processing method, comprising:
holding a substrate to be processed on a main surface of an RF electrode which is disposed opposite to an opposing electrode in a chamber of which an interior is evacuated under a predetermined pressure lower than 200 mTorr;
continuously applying an RF voltage with a predetermined frequency $\omega rf/2\pi$ of 50 MHz or over to said RF electrode by a voltage applying device continuously to generate plasma in the chamber;
applying a pulsed voltage to said RF electrode so as to be superimposed with said RF voltage; and
controlling at least a pulse width t1 (s) and a voltage value $V_{pulse}$ of said pulsed voltage so that the relation of $t1 \geq 2\pi/(\omega p/5)$ is satisfied (herein, $\omega p$ is a plasma ion frequency and represented as $\omega p=(e^2 N_0/\in_0 Mi)^{1/2}$; e: elementary charge, $\in_0$: vacuum dielectric constant, Mi: ion mass (kg), $N_0$: plasma density (/m$^3$)), and the relation of $|V_{p-p}|<|V_{pulse}|$ is satisfied (herein, $V_{p-p}$ is a voltage value of the RF voltage).

2. The method as set forth in claim 1,
wherein said pulsed voltage, which is applied to said RF electrode from a pulsed voltage applying device, is set to a negative pulsed voltage.

3. The method as set forth in claim 1,
wherein a higher energy side peak of ions incident onto said substrate is adjusted within an energy range suitable for an intended substrate processing.

4. The method as set forth in claim 1,
wherein an ion energy in a plasma generated between said RF electrode and said opposing electrode is divided into a higher energy side peak and a lower energy side peak so that an energy difference between said higher energy side peak and said lower energy side peak is changeable by controlling a pulse width t1, a period t2, a pulsed voltage value $V_{pulse}$ of said pulsed voltage.

5. The method as set forth in claim 4,
wherein said higher energy side peak is shifted so that ions only within said higher energy side peak can be utilized for substrate processing.

6. The method as set forth in claim 4,
wherein said lower energy peak is shifted in the vicinity of said higher energy peak so that it can be considered that said lower energy peak is combined with said higher energy peak, thereby forming one energy peak, and ions within the thus obtained one energy peak is utilized for substrate processing.

7. The method as set forth in claim 1,
wherein said pulsed voltage applying device for applying a plurality of pulsed voltages with respective different phases and/or respective different voltage values $V_{pulse}$ to said RF electrode so as to be superimposed with said RF voltage.

8. The method as set forth in claim 1,
wherein applying an RF voltage comprises applying an RF voltage with a voltage applying device including a high-pass filter for passing said RF voltage and shutting off said pulsed voltage.

9. The method as set forth in claim 1, further comprising:
monitoring an energy state of ions at least located between said RF electrode and said opposing electrode by an ion energy detecting device.

10. The method as set forth in claim 1, further comprising:
varying at least one of the group consisting of a pulse width t1, a period t2, a pulsed voltage value $V_{pulse}$ of said pulsed voltage so that at least one of a value and a width of an ion energy of ions incident onto said substrate is varied in accordance with processing stage or processing switching.

* * * * *